(12) United States Patent
Li et al.

(10) Patent No.: US 11,114,509 B2
(45) Date of Patent: Sep. 7, 2021

(54) OLED DISPLAY DEVICE WITH FINGERPRINT ON DISPLAY

(71) Applicant: WUHAN CHINA STAR OPTOELECTRONICS SEMICONDUCTOR DISPLAY TECHNOLOGY CO., LTD., Wuhan (CN)

(72) Inventors: Chao Li, Wuhan (CN); Shijuan Yi, Wuhan (CN)

(*) Notice: Subject to any disclaimer, the term of this patent is extended or adjusted under 35 U.S.C. 154(b) by 295 days.

(21) Appl. No.: 16/342,211

(22) PCT Filed: Dec. 14, 2018

(86) PCT No.: PCT/CN2018/121005
§ 371 (c)(1),
(2) Date: Apr. 16, 2019

(87) PCT Pub. No.: WO2020/113651
PCT Pub. Date: Jun. 11, 2020

(65) Prior Publication Data
US 2021/0183956 A1    Jun. 17, 2021

(30) Foreign Application Priority Data
Dec. 7, 2018    (CN) .......................... 201811497450.0

(51) Int. Cl.
*G09G 3/32*    (2016.01)
*H01L 27/32*    (2006.01)
(Continued)

(52) U.S. Cl.
CPC .......... *H01L 27/323* (2013.01); *G06K 9/0002* (2013.01); *H01L 27/3218* (2013.01); *H01L 27/3276* (2013.01); *H01L 51/5253* (2013.01)

(58) Field of Classification Search
CPC ........... H01L 27/32; H01L 51/52; G06K 9/00; G06F 3/033; G06F 3/02; G09G 5/08; G09G 5/00; G09G 3/32
See application file for complete search history.

(56) References Cited

U.S. PATENT DOCUMENTS

2013/0076485 A1* 3/2013 Mullins .................. G06F 21/32
340/5.83
2017/0372110 A1* 12/2017 Uehara ............... G06F 3/03547
(Continued)

*Primary Examiner* — Pegeman Karimi

(57) ABSTRACT

The present disclosure proposes an OLED display device with FOD that includes an OLED display panel and a fingerprint recognition module disposed under the OLED display panel. Sub-pixels arranged in an array on a substrate are located in an effective display area of the substrate. A fingerprint recognition block is disposed in the effective display area. The fingerprint recognition module is disposed corresponding to the fingerprint recognition block. A number of TFTs in each of the sub-pixels located in the fingerprint recognition block is less than a number of TFTs in each of the sub-pixels outside the fingerprint recognition block. Through decreasing the number of the TFTs in each of the sub-pixels in the fingerprint recognition block, the number of films in the stack of the fingerprint recognition block is reduced. Accordingly, the transmittance of the fingerprint recognition block and the accuracy of fingerprint recognition are improved.

8 Claims, 6 Drawing Sheets

(51) Int. Cl.
*G06K 9/00* (2006.01)
*H01L 51/52* (2006.01)

(56) References Cited

U.S. PATENT DOCUMENTS

| | | | | |
|---|---|---|---|---|
| 2018/0075804 A1* | 3/2018 | Kim | ..................... | G09G 3/3233 |
| 2019/0080131 A1* | 3/2019 | Lee | ..................... | G06K 9/0002 |
| 2019/0227362 A1* | 7/2019 | Sun | ..................... | G02F 1/1333 |
| 2019/0266379 A1* | 8/2019 | Huang | ..................... | G06K 9/00 |
| 2019/0384959 A1* | 12/2019 | Lee | ..................... | G06K 9/00006 |
| 2020/0035151 A1* | 1/2020 | Feng | ..................... | G09G 3/3233 |
| 2020/0083302 A1* | 3/2020 | Park | ..................... | H01L 27/3272 |
| 2020/0111851 A1* | 4/2020 | Park | ..................... | H01L 27/3234 |

* cited by examiner

OLED DISPLAY DEVICE WITH FINGERPRINT ON DISPLAY

BACKGROUND

1. Field of the Invention

The present disclosure relates to the field of display technology, more particularly, to an organic light emitting diode (OLED) display device with fingerprint on display (FOD).

2. Description of the Related Art

With the development of display technology, flat display devices are extensively used in various consumer electronic products, including mobile phones, televisions, personal digital assistants, digital cameras, notebook computers, desktop computers, and the like, and have become the mainstream in display devices, due to their advantages of high image quality, power saving, slim body, and wide application range, etc.

An OLED display has the excellent characteristics of self illumination, no need for backlight, having high contrast, a small thickness, a wide viewing angle and fast response, ability to be used in a flexible panel, having a wide range of operating temperature, a simple structure and a simple process. As a result, it is considered to be an emerging application technology for next-generation flat panel displays.

The OLED display device generally comprises a substrate, an anode disposed on the substrate, a hole injection layer disposed on the anode, a hole transport layer disposed on the hole injection layer, a light emitting layer disposed on the hole transport layer, an electron transport layer disposed on the light emitting layer, an electron injection layer disposed on the electron transport layer, and a cathode disposed on the electron injection layer. The light emitting principle of the OLED display device is as follows. The semiconductor and organic light emitting materials are driven by an electric field to emit light through injection and recombination of carriers. In greater detail, the OLED display device usually uses an ITO pixel electrode and a metal electrode as the anode and the cathode of the device, respectively. When being driven by a certain voltage, electrons and holes are respectively injected from the cathode and the anode to the electron transport layer and the hole transport layer. The electrons and holes migrate to the light emitting layer respectively through the electron transport layer and the hole transport layer, and meet in the light emitting layer to form excitons and excite the light emitting molecules. The latter emit visible light through radiation relaxation.

As a kind of biometric technology, fingerprint recognition technology has the characteristics of universality, uniqueness, security and collectability. It has been widely used in products, such as smart phones. With the rise of full-screen technology, fingerprint recognition has gradually evolved from being designed in the outside of the display screen to the inside of the display screen, that is, fingerprint on display (FOD) technology, in order to pursue a higher screen-to-body ratio. However, the working principle of the OLED display devices with FOD on the market is as follows. Light emitted from the OLED passes through the screen and is reflected by the finger to pass through the screen again, and is captured by the fingerprint recognition sensor. The fingerprint recognition sensor captures light to form photo-generated carriers and form the fingerprint image. The fingerprint image is then matched with the previously recorded fingerprint to unlock. In the related art, light needs to pass through various film layers in the display area when recognizing the fingerprint. The transmittance is thus very low. Therefore, the brightness received by the fingerprint recognition sensor is low, which in turn reduces the accuracy of fingerprint recognition.

SUMMARY

One objective of the present disclosure is to provide an OLED display device with FOD that can reduce the number of films in the stack of the fingerprint recognition block to improve the transmittance of the fingerprint recognition block and the accuracy of fingerprint recognition.

The present disclosure provides an OLED display device with FOD that comprises an OLED display panel and a fingerprint recognition module disposed under the OLED display panel;

the OLED display panel comprising a substrate and a plurality of sub-pixels arranged in an array on the substrate;

the substrate comprising an effective display area, the sub-pixels being located in the effective display area, a fingerprint recognition block being disposed in the effective display area, and the fingerprint recognition module being disposed corresponding to the fingerprint recognition block;

a number of thin film transistors (TFTs) in each of the sub-pixels located in the fingerprint recognition block being less than a number of TFTs in each of the sub-pixels outside the fingerprint recognition block.

According to one embodiment of the present disclosure, the OLED display device further comprises a protective coating on a surface of the substrate adjacent to the fingerprint recognition module, a cover plate on the plurality of sub-pixels arranged in the array and the substrate, and a screen protective layer on the cover plate.

According to one embodiment of the present disclosure, the OLED display further comprises a fingerprint recognition driver circuit board on one side of the fingerprint recognition module away from the substrate and electrically connected to the fingerprint recognition module.

According to one embodiment of the present disclosure, shapes of the effective display area and the fingerprint recognition block are both a rectangle, and the fingerprint recognition block is located at a corner of the effective display area.

According to one embodiment of the present disclosure, the substrate further comprises a frame area surrounding the effective display area, a first scan driving circuit and a second scan driving circuit are disposed in the frame area, the first scan driving circuit is configured to drive the sub-pixels in the fingerprint recognition block to emit light, and the second scan driving circuit is configured to drive the sub-pixels outside the fingerprint recognition block to emit light.

According to one embodiment of the present disclosure, each of the sub-pixels in the fingerprint recognition block comprises a first TFT, a second TFT, a first storage capacitor and a first OLED;

a gate of the first TFT is electrically connected to a first node, a source of the first TFT is electrically connected to a power supply voltage, a drain of the first TFT is electrically connected to an anode of the first OLED;

a gate of the second TFT receives a switch signal, a source of the second TFT receives a data signal, a drain of the second TFT is electrically connected to the first node;

a first terminal of the first storage capacitor is electrically connected to the first node, a second terminal of the first storage capacitor is electrically connected to the source of the first TFT;

a cathode of the first OLED is grounded;

the switch signal is provided by the first scan driving circuit.

According to one embodiment of the present disclosure, each of the sub-pixels outside the fingerprint recognition block comprises a third TFT, a fourth TFT, a fifth TFT, a sixth TFT, a seventh TFT, an eighth TFT, a ninth TFT, a second storage capacitor and a second OLED;

a gate of the third TFT receives a first scan signal, a source of the third TFT is electrically connected to a second node, a drain of the third TFT is electrically connected to a third node;

a gate of the fourth TFT receives a second scan signal, a source of the fourth TFT is electrically connected to the second node, a drain of the fourth TFT is electrically connected to a source of the seventh TFT;

a gate of the fifth TFT receives a light emitting control signal, a source of the fifth TFT receives the power supply voltage, a drain of the fifth TFT is electrically connected to a source of the ninth TFT;

a gate of the sixth TFT receives the light emitting control signal, a source of the sixth TFT is electrically connected to the third node, a drain of the sixth TFT is electrically connected to an anode of the second OLED;

a gate of the seventh TFT receives a third scan signal, the source of the seventh TFT receives an initialization voltage, a drain of the seventh TFT is electrically connected to the anode of the second OLED;

a gate of the eighth TFT receives the first scan signal, a source of the eighth TFT receives the data signal, a drain of the eighth TFT is electrically connected to the source of the ninth TFT;

a gate of the ninth TFT is electrically connected to the second node, a drain of the ninth TFT is electrically connected to the third node;

a first terminal of the second storage capacitor is electrically connected to the second node, a second terminal of the second storage capacitor is electrically connected to the source of the fifth TFT;

a cathode of the second OLED is grounded;

the first scan signal, the second scan signal, the third scan signal and the light emitting control signal are all provided by the second scan driving circuit.

According to one embodiment of the present disclosure, the second scan driving circuit comprises a first scan drive unit and a second scan drive unit respectively located on two sides of the effective display area, the first scan driving circuit and the second scan drive unit are arranged on a same side of the effective display area.

According to one embodiment of the present disclosure, the fingerprint recognition module is a fingerprint recognition sensor.

According to one embodiment of the present disclosure, the substrate is a transparent substrate.

The beneficial effects of the present disclosure are as follows. The present disclosure provides an OLED display device with FOD that comprises an OLED display panel and a fingerprint recognition module disposed under the OLED display panel. The OLED display panel comprises a substrate and a plurality of sub-pixels arranged in an array on the substrate. The substrate comprises an effective display area. The sub-pixels are located in the effective display area. A fingerprint recognition block is disposed in the effective display area. The fingerprint recognition module is disposed corresponding to the fingerprint recognition block. A number of thin film transistors (TFTs) in each of the sub-pixels located in the fingerprint recognition block is less than a number of TFTs in each of the sub-pixels outside the fingerprint recognition block. Through decreasing the number of the TFTs in each of the sub-pixels in the fingerprint recognition block, the number of films in the stack of the fingerprint recognition block can be reduced. As a result, the transmittance of the fingerprint recognition block the accuracy of fingerprint recognition are improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
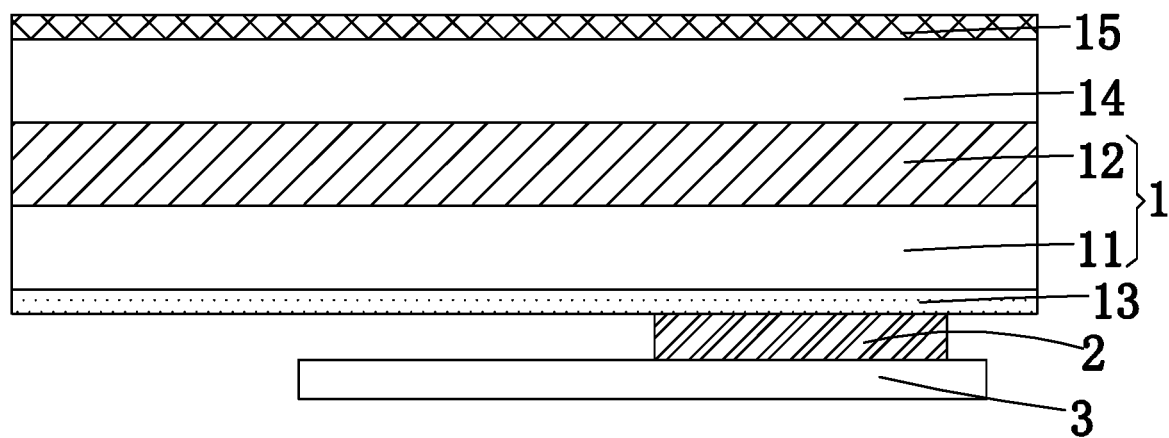
FIG. 1 is a schematic diagram of an OLED display device with FOD according to the present disclosure.

For the purpose of description rather than limitation, the following provides such specific details as a specific system structure, interface, and technology for a thorough understanding of the application. However, it is understandable by persons skilled in the art that the application can also be implemented in other embodiments not providing such specific details.

A description is provided with reference to FIG. 1 to FIG. 4. The present disclosure provides an OLED display device with FOD, which comprises an OLED display panel 1 and a fingerprint recognition module 2 disposed under the OLED display panel 1.

The OLED display panel 1 comprises a substrate 11 and a plurality of sub-pixels 12 arranged in an array on the substrate 11.

The substrate 11 comprises an effective display area 111. The sub-pixels 12 are located in the effective display area 111. A fingerprint recognition block 21 is disposed in the effective display area 111, and the fingerprint recognition module 2 is disposed corresponding to the fingerprint recognition block 21.

A number of thin film transistors (TFTs) in each of the sub-pixels 12 located in the fingerprint recognition block 21 is less than a number of TFTs in each of the sub-pixels 12 outside the fingerprint recognition block 21.

As shown in FIG. 1, the OLED display panel 1 further comprises a protective coating 13 on a surface of the substrate 11 adjacent to the fingerprint recognition module 2, a cover plate 14 on the plurality of sub-pixels 12 arranged in the array and the substrate 11, and a screen protective layer 15 on the cover plate 14.

The substrate 11 is a transparent substrate.

The OLED display device with FOD further comprises a fingerprint recognition driver circuit board 3 on one side of the fingerprint recognition module 2 away from the substrate 11 and electrically connected to the fingerprint recognition module 2.

The substrate 11 further comprises a frame area 112 surrounding the effective display area 111. A first scan driving circuit 113 and a second scan driving circuit 114 are disposed in the frame area 112. The first scan driving circuit 113 is configured to drive the sub-pixels 12 in the fingerprint recognition block 21 to emit light, and the second scan driving circuit 114 is configured to drive the sub-pixels 12 outside the fingerprint recognition block 21 to emit light.

Figure 2:
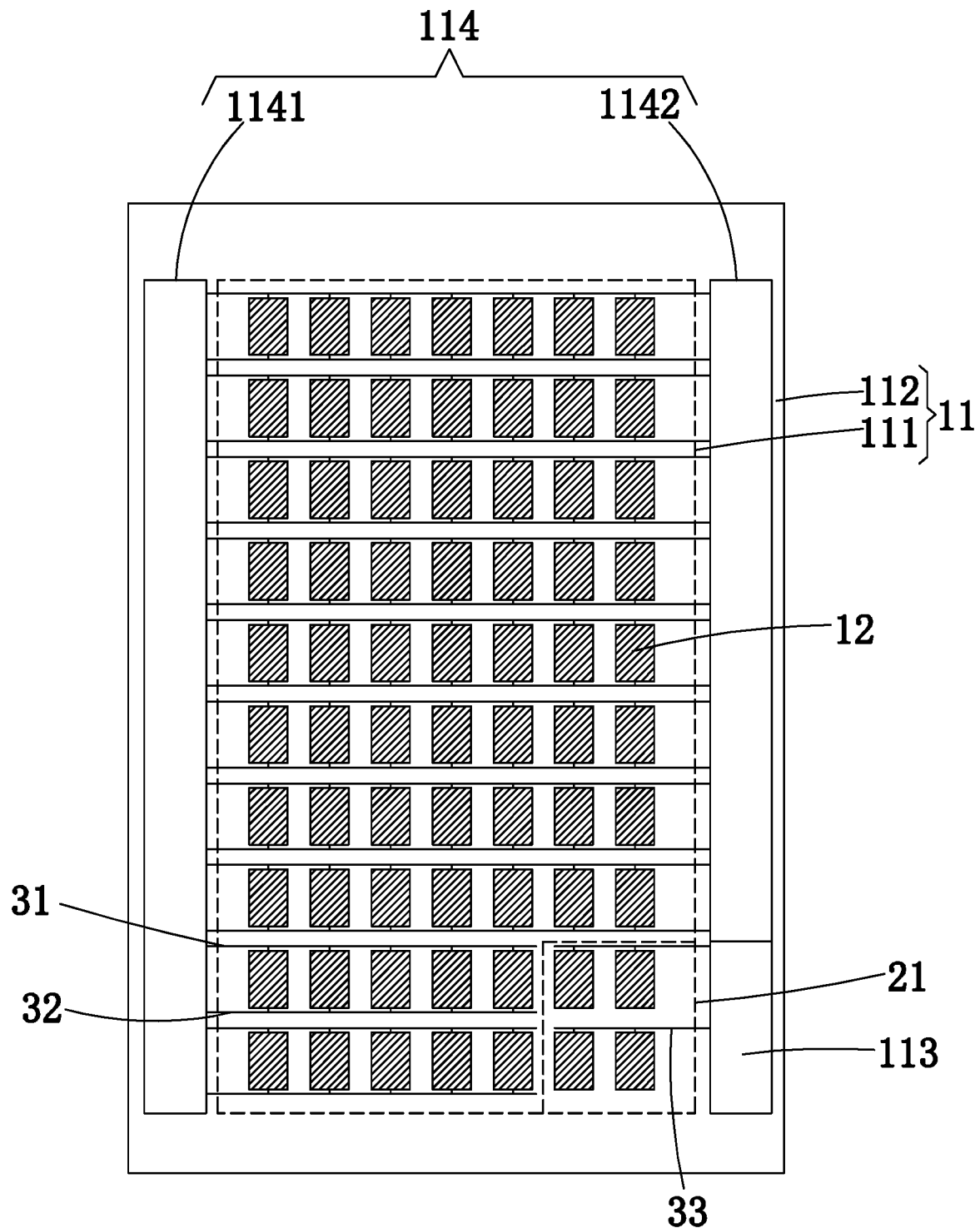
FIG. 2 is a schematic diagram of an OLED display panel in an OLED display device with FOD according to the present disclosure.

As shown in FIG. 2, the second scan driving circuit 114 comprises a first scan drive unit 1141 and a second scan drive unit 1142 respectively located on two sides of the effective display area 111. The first scan driving circuit 113 and the second scan drive unit 1142 are arranged on a same side of the effective display area 111.

According to some embodiments of the present disclosure, shapes of the effective display area 111 and the fingerprint recognition block 21 are both a rectangle, and the fingerprint recognition block 21 is located at a corner of the effective display area 111.

According to some embodiments of the present disclosure, the fingerprint recognition block 21 is located at the corner on a first side of the effective display area 111. The first scan drive unit 1141 is located on a second side of the effective display area 111 opposite to the first side. Both the second scan drive unit 1142 and the first scan driving circuit 113 are located on the first side of the effective display area 111, and the first scan driving circuit 113 is opposite to the fingerprint recognition block 21. That is, as shown in FIG. 2, the fingerprint recognition block 21 is located at a lower right corner of the effective display area 111. The first scan drive unit 1141 is located on a left side of the effective display area 111. The second scan drive unit 1142 and the first scan driving circuit 113 are both located on a right side of the effective display area 111, and the first scan driving circuit 113 is located under the second scan drive unit 1142 and is opposite to the fingerprint recognition block 21.

Figure 3:
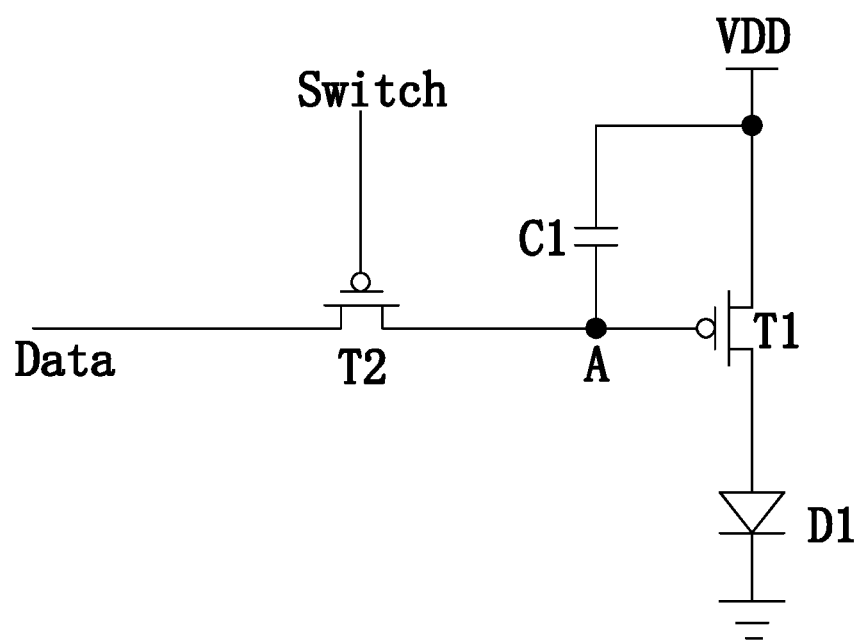
FIG. 3 is a circuit diagram of a sub-pixel located in a fingerprint recognition block in an OLED display device with FOD according to the present disclosure.

As shown in FIG. 3, each of the sub-pixels 12 in the fingerprint recognition block 21 comprises a first TFT T1, a second TFT T2, a first storage capacitor C1 and a first OLED D1.

A gate of the first TFT T1 is electrically connected to a first node A. A source of the first TFT T1 is electrically connected to a power supply voltage Vdd. A drain of the first TFT T1 is electrically connected to an anode of the first OLED D1.

A gate of the second TFT T2 receives a switch signal Switch. A source of the second TFT T2 receives a data signal Data. A drain of the second TFT T2 is electrically connected to the first node A.

A first terminal of the first storage capacitor C1 is electrically connected to the first node A. A second terminal of the first storage capacitor C1 is electrically connected to the source of the first TFT T1.

A cathode of the first OLED D1 is grounded.

The switch signal Switch is provided by the first scan driving circuit 113.

Figure 4:
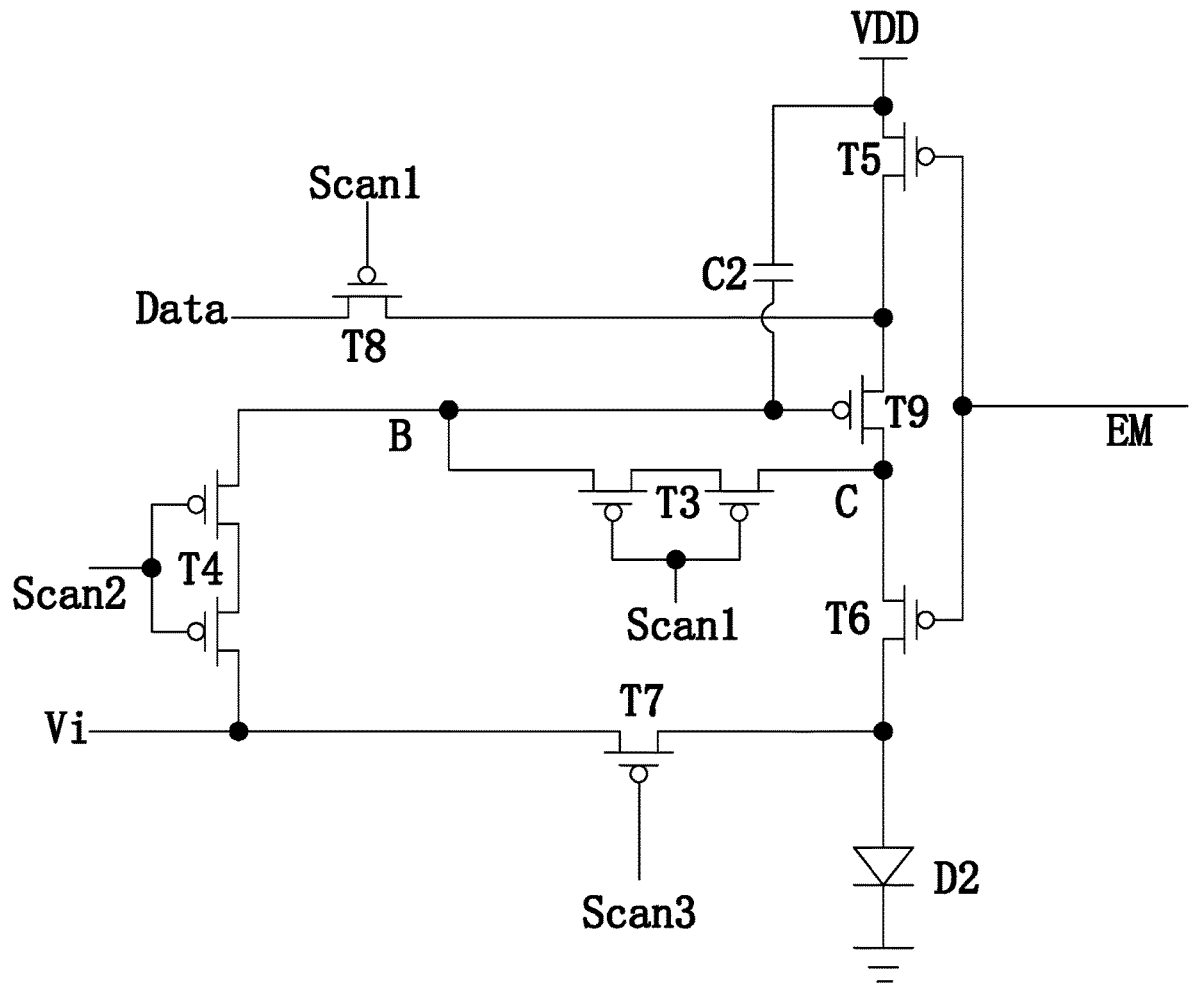
FIG. 4 is a circuit diagram of a sub-pixel outside a fingerprint recognition block in an OLED display device with FOD according to the present disclosure.

As shown in FIG. 4, each of the sub-pixels 12 outside the fingerprint recognition block 21 comprises a third TFT T3, a fourth TFT T4, a fifth TFT T5, a sixth TFT T6, a seventh TFT T7, an eighth TFT T8, a ninth TFT T9, a second storage capacitor C2 and a second OLED D2, according to some embodiments of the present disclosure.

A gate of the third TFT T3 receives a first scan signal Scan1. A source of the third TFT T3 is electrically connected to a second node B. A drain of the third TFT T3 is electrically connected to a third node C.

A gate of the fourth TFT T4 receives a second scan signal Scan 2. A source of the fourth TFT T4 is electrically connected to the second node B. A drain of the fourth TFT T4 is electrically connected to a source of the seventh TFT T7.

A gate of the fifth TFT T5 receives a light emitting control signal EM. A source of the fifth TFT T5 receives the power supply voltage Vdd. A drain of the fifth TFT T5 is electrically connected to a source of the ninth TFT T9.

A gate of the sixth TFT T6 receives the light emitting control signal EM. A source of the sixth TFT T6 is electrically connected to the third node C. A drain of the sixth TFT T6 is electrically connected to an anode of the second OLED D2.

A gate of the seventh TFT T7 receives a third scan signal Scan3. The source of the seventh TFT T7 receives an initialization voltage Vi. A drain of the seventh TFT T7 is electrically connected to the anode of the second OLED D2.

A gate of the eighth TFT T8 receives the first scan signal Scan1. A source of the eighth TFT T8 receives the data signal Data. A drain of the eighth TFT T8 is electrically connected to the source of the ninth TFT T9.

A gate of the ninth TFT T9 is electrically connected to the second node B. A drain of the ninth TFT T9 is electrically connected to the third node C.

A first terminal of the second storage capacitor C2 is electrically connected to the second node B. A second terminal of the second storage capacitor C2 is electrically connected to the source of the fifth TFT T5.

A cathode of the second OLED D2 is grounded.

The first scan signal Scan1, the second scan signal Scan2, the third scan signal Scan3 and the light emitting control signal EM are all provided by the second scan driving circuit 114.

The first scan signal Scan1 is a scan signal for a pixel row where the sub-pixels 12 are located. The second scan signal Scan2 is a scan signal for a previous row of the pixel row where the sub-pixels 12 are located. The third scan signal Scan3 is an inverted signal of the first scan signal Scan1. The first TFT T1 to the ninth TFT T9 are all P-type TFTs. Each of the third TFT T3 and the fourth TFT T4 is composed of two P-type TFTs connected in series.

All rows of sub-pixels 12 are divided into two blocks based on their connection lines to the first scan driving circuit 113 and the second scan driving circuit 114. Each row of sub-pixels 12 in a first block are all located outside the fingerprint recognition block 21. That is, each row of sub-pixels 12 in the first block do not comprise the sub-pixels 12 located in the fingerprint recognition block 21. Each row of sub-pixels 12 in the first block are connected to the second scan driving circuit 114 through signal lines passing through the each entire row of sub-pixels 12. Each row of sub-pixels 12 in a second block comprise some of the sub-pixels 12 located in the fingerprint recognition block 21 and some of the sub-pixels 12 outside the fingerprint recognition block 21. In each row of sub-pixels 12 in the second block, the sub-pixels 12 located in the fingerprint recognition block 21 are connected to the first scan driving circuit 113 through a first signal line, and the sub-pixels 12 outside the fingerprint recognition block 21 are connected to the second scan driving circuit 114 through second signal lines. The first signal line and the second signal lines are insulated from each other.

A description is provided with reference to the above embodiment. As shown in FIG. 2, a scan signal line 31 electrically connected to each row of sub-pixels 12 above the fingerprint recognition block 21 and a light emitting control signal line 32 electrically connected to the each row of sub-pixels 12 above the fingerprint recognition block 21 are disposed corresponding to the each row of sub-pixels 12 above the fingerprint recognition block 21. Two terminals 32 of each of the scan signal lines 31 and each of the light emitting control signal lines 32 are respectively connected to the first scan drive unit 1141 and the second scan drive unit 1142. The scan signal line 31 electrically connected to each row of sub-pixels 12 on a left side of the fingerprint recognition block 21 and the light emitting control signal line 32 electrically connected to the each row of sub-pixels 12 on the left side of the fingerprint recognition block 21 are disposed corresponding to the each row of sub-pixels 12 on the left side of the fingerprint recognition block 21. Left terminals of each of the scan signal lines 31 and each of the light emitting control signal lines 32 are connected to the first scan drive unit 1141. A switch signal line 33 electrically connected to each row of sub-pixels 12 in the fingerprint recognition block 21 is disposed corresponding to the each row of sub-pixels in the fingerprint recognition block 21, and a right terminal of each of the switch signal lines 33 is electrically connected to the first scan driving circuit 113.

Figure 5:
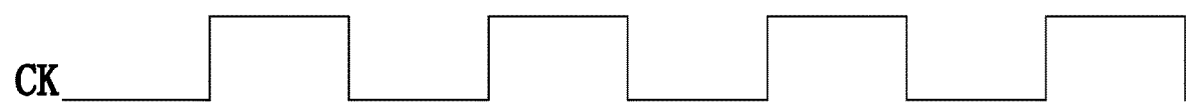
FIG. 5 is a waveform diagram of a second scan driving circuit of an OLED display device with FOD according to the present disclosure.
Figure 5:
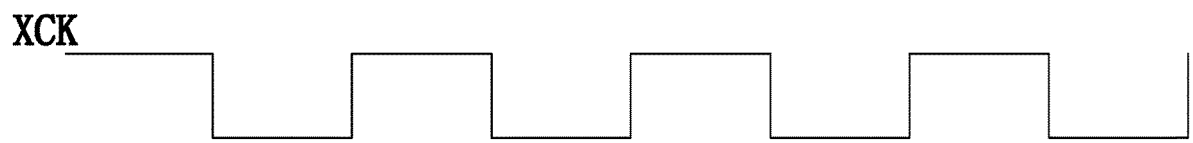
Figure 5:
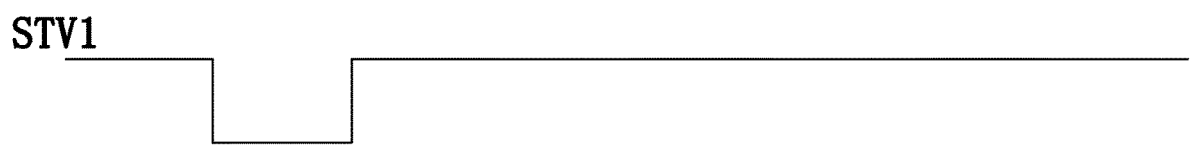
Figure 6:
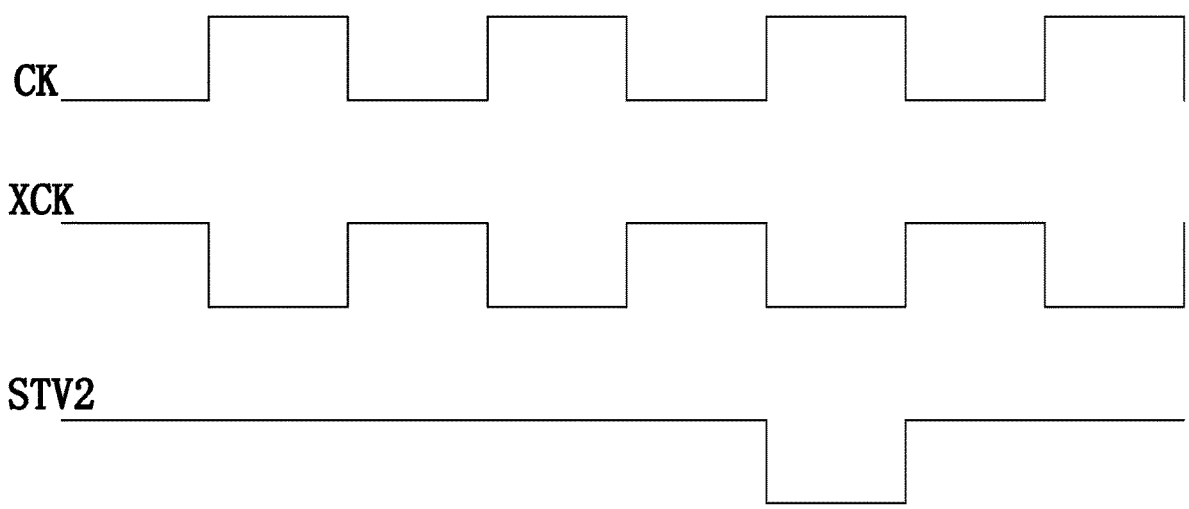
FIG. 6 is a waveform diagram of a first scan driving circuit of an OLED display device with FOD according to the present disclosure.

As shown in FIG. 5 and FIG. 6, a first start signal STV1, a clock signal CK, and a inverted clock signal XCK are first provided to the second scan driving circuit 114, so that each row of sub-pixels 12 are progressively scanned from top to bottom. When a second row of sub-pixels above a first row of sub-pixels 12 in the fingerprint recognition block 21 is scanned, a second start signal STV2, the clock signal CK, and the inverted clock signal XCK are provided to the first scan driving circuit 113 so as to scan the sub-pixels 12 in the fingerprint recognition block 21.

Each of the first scan drive unit 1141 and the second scan drive unit 1142 comprises a light emitting signal generation unit and a scan signal generation unit. The light emitting signal generation unit is configured to generate the light emitting control signal EM for driving the sub-pixels 12 outside the fingerprint recognition block 21. The scan signal generation unit is configured to generate the first scan signal Scan1, the second scan signal Scan2, and the third scan signal Scan3 for driving the sub-pixels 12 outside the fingerprint recognition block 21.

Each of the first scan driving circuit 113 and the second scan driving circuit 114 is a gate on array (GOA) circuit.

The fingerprint recognition module 2 is a fingerprint recognition sensor. When operating, each of the sub-pixels 12 emits light that passes through the cover plate 14 and the screen protective layer 15 to irradiate a finger. The light is reflected by the finger and then passes through the screen protective layer 15, the cover plate 14, the sub-pixel 12 and the substrate 11 to irradiate the fingerprint recognition module 2. The fingerprint recognition module 2 captures the light to form photogenerated carriers and form a fingerprint image. The fingerprint image is thereafter matched with the previously recorded fingerprint to unlock. Since the number of the TFTs in each of the sub-pixels in the fingerprint recognition block 21 is lesser, the number of films in the stack of the fingerprint recognition block can be reduced. The transmittance of the fingerprint recognition block is higher. The loss is lesser when the light is reflected back and irradiates the fingerprint recognition module 2, and the accuracy of fingerprint recognition is higher.

The present disclosure provides an OLED display device with FOD that comprises an OLED display panel and a fingerprint recognition module disposed under the OLED display panel. The OLED display panel comprises a substrate and a plurality of sub-pixels arranged in an array on the substrate. The substrate comprises an effective display area. The sub-pixels are located in the effective display area. A fingerprint recognition block is disposed in the effective display area. The fingerprint recognition module is disposed corresponding to the fingerprint recognition block. A number of thin film transistors (TFTs) in each of the sub-pixels located in the fingerprint recognition block is less than a number of TFTs in each of the sub-pixels outside the fingerprint recognition block. Through decreasing the number of the TFTs in each of the sub-pixels in the fingerprint recognition block, the number of films in the stack of the fingerprint recognition block can be reduced. As a result, the transmittance of the fingerprint recognition block the accuracy of fingerprint recognition are improved.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An organic light emitting diode (OLED) display device with fingerprint on display (FOD) comprising:
   an OLED display panel comprising:
      a substrate; and
      a plurality of sub-pixels arranged in an array on the substrate; and
   a fingerprint recognition module disposed under the OLED display panel;
   wherein the substrate comprises an effective display area, the sub-pixels are located in the effective display area, a fingerprint recognition block is disposed in the effective display area, and the fingerprint recognition module is disposed corresponding to the fingerprint recognition block;
   a number of thin film transistors (TFTs) in each of the sub-pixels located in the fingerprint recognition block is less than a number of TFTs in each of the sub-pixels outside the fingerprint recognition block,
   wherein the substrate further comprises a frame area surrounding the effective display area, a first scan driving circuit and a second scan driving circuit are disposed in the frame area, the first scan driving circuit is configured to drive the sub-pixels in the fingerprint recognition block to emit light, and the second scan driving circuit is configured to drive the sub-pixels outside the fingerprint recognition block to emit light,
   wherein each of the sub-pixels outside the fingerprint recognition block comprises a third TFT, a fourth TFT, a fifth TFT, a sixth TFT, a seventh TFT, an eighth TFT, a ninth TFT, a second storage capacitor and a second OLED;

a gate of the third TFT receives a first scan signal, a source of the third TFT is electrically connected to a second node, a drain of the third TFT is electrically connected to a third node;

a gate of the fourth TFT receives a second scan signal, a source of the fourth TFT is electrically connected to the second node, a drain of the fourth TFT is electrically connected to a source of the seventh TFT;

a gate of the fifth TFT receives a light emitting control signal, a source of the fifth TFT receives the power supply voltage, a drain of the fifth TFT is electrically connected to a source of the ninth TFT;

a gate of the sixth TFT receives the light emitting control signal, a source of the sixth TFT is electrically connected to the third node, a drain of the sixth TFT is electrically connected to an anode of the second OLED;

a gate of the seventh TFT receives a third scan signal, the source of the seventh TFT receives an initialization voltage, a drain of the seventh TFT is electrically connected to the anode of the second OLED;

a gate of the eighth TFT receives the first scan signal, a source of the eighth TFT receives the data signal, a drain of the eighth TFT is electrically connected to the source of the ninth TFT;

a gate of the ninth TFT is electrically connected to the second node, a drain of the ninth TFT is electrically connected to the third node;

a first terminal of the second storage capacitor is electrically connected to the second node, a second terminal of the second storage capacitor is electrically connected to the source of the fifth TFT;

a cathode of the second OLED is grounded;

the first scan signal, the second scan signal, the third scan signal and the light emitting control signal are all provided by the second scan driving circuit.

2. The OLED display device as claimed in claim 1, wherein the OLED display device further comprises a protective coating on a surface of the substrate adjacent to the fingerprint recognition module, a cover plate on the plurality of sub-pixels arranged in the array and the substrate, and a screen protective layer on the cover plate.

3. The OLED display device as claimed in claim 1, further comprising a fingerprint recognition driver circuit board on one side of the fingerprint recognition module away from the substrate and electrically connected to the fingerprint recognition module.

4. The OLED display device as claimed in claim 1, wherein shapes of the effective display area and the fingerprint recognition block are both a rectangle, and the fingerprint recognition block is located at a corner of the effective display area.

5. The OLED display device as claimed in claim 1, wherein each of the sub-pixels in the fingerprint recognition block comprises a first TFT, a second TFT, a first storage capacitor and a first OLED;

a gate of the first TFT is electrically connected to a first node, a source of the first TFT is electrically connected to a power supply voltage, a drain of the first TFT is electrically connected to an anode of the first OLED;

a gate of the second TFT receives a switch signal, a source of the second TFT receives a data signal, a drain of the second TFT is electrically connected to the first node;

a first terminal of the first storage capacitor is electrically connected to the first node, a second terminal of the first storage capacitor is electrically connected to the source of the first TFT;

a cathode of the first OLED is grounded;

the switch signal is provided by the first scan driving circuit.

6. The OLED display device as claimed in claim 1, wherein the second scan driving circuit comprises a first scan drive unit and a second scan drive unit respectively located on two sides of the effective display area, the first scan driving circuit and the second scan drive unit are arranged on a same side of the effective display area.

7. The OLED display device as claimed in claim 1, wherein the fingerprint recognition module is a fingerprint recognition sensor.

8. The OLED display device as claimed in claim 1, wherein the substrate is a transparent substrate.

* * * * *